(12) United States Patent
Tanaka et al.

(10) Patent No.: US 8,948,606 B2
(45) Date of Patent: Feb. 3, 2015

(54) SEMICONDUCTOR OPTICAL AMPLIFIER

(75) Inventors: Shinsuke Tanaka, Kawasaki (JP);
Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 699 days.

(21) Appl. No.: 13/219,953

(22) Filed: Aug. 29, 2011

(65) Prior Publication Data

US 2012/0070156 A1 Mar. 22, 2012

(30) Foreign Application Priority Data

Sep. 21, 2010 (JP) ................................ 2010-210770

(51) Int. Cl.
| | | |
|---|---|---|
| *H04B 10/00* | (2013.01) | |
| *H01S 5/50* | (2006.01) | |
| *B82Y 20/00* | (2011.01) | |
| *H01S 5/10* | (2006.01) | |
| *H04B 10/12* | (2006.01) | |
| *H01S 5/00* | (2006.01) | |
| *H01S 5/022* | (2006.01) | |
| *H01S 5/0625* | (2006.01) | |
| *H01S 5/22* | (2006.01) | |
| *H01S 5/323* | (2006.01) | |
| *H01S 5/343* | (2006.01) | |

(52) U.S. Cl.
CPC . *H01S 5/50* (2013.01); *B82Y 20/00* (2013.01); *H01S 5/1057* (2013.01); *H01S 5/0064* (2013.01); *H01S 5/02288* (2013.01); *H01S 5/0625* (2013.01); *H01S 5/1039* (2013.01); *H01S 5/106* (2013.01); *H01S 5/1064* (2013.01); *H01S 5/2224* (2013.01); *H01S 5/32333* (2013.01); *H01S 5/3235* (2013.01); *H01S 5/34306* (2013.01)
USPC .......................................... 398/180; 398/173

(58) Field of Classification Search
CPC . H04B 10/29; H04B 10/2912; H04B 10/2914
USPC ............................ 398/173, 175, 180; 359/344
See application file for complete search history.

(56) References Cited

U.S. PATENT DOCUMENTS

| | | |
|---|---|---|
| 5,200,968 A | 4/1993 | Kurakake |
| 5,579,155 A | 11/1996 | Kitamura |
| 2006/0291038 A1* | 12/2006 | Matsumoto et al. .......... 359/344 |

FOREIGN PATENT DOCUMENTS

| | | |
|---|---|---|
| JP | 3-284892 | 12/1991 |
| JP | 4-217382 | 8/1992 |
| JP | 5-67845 | 3/1993 |
| JP | 7-135372 | 5/1995 |

* cited by examiner

*Primary Examiner* — Daniel Dobson
(74) *Attorney, Agent, or Firm* — Kratz, Quintos & Hanson, LLP

(57) ABSTRACT

A semiconductor optical amplifier includes an n-type semiconductor layer, a p-type semiconductor layer an active layer provided between the n-type semiconductor layer and the p-type semiconductor layer, the active layer transmitting an optical signal and a current-injection part that injects current into the active layer via the n-type semiconductor layer and the p-type semiconductor layer, the active layer including a first active layer that includes AlGaInAs, and a second active layer that includes GaInAsP, the second active layer provided closer to an output side than the first active layer, and the first active layer and the second active layer being butt-jointed.

15 Claims, 15 Drawing Sheets

SEMICONDUCTOR OPTICAL AMPLIFIER

CROSS-REFERENCE TO RELATED APPLICATION

This application is based upon and claims the benefit of priority of the prior Japanese Patent Application No. 2010-210770, filed on Sep. 21, 2010, the entire contents of which are incorporated herein by reference.

FIELD

The embodiments discussed herein relate to a semiconductor optical amplifier and the like.

BACKGROUND

Recently, due to increasing data traffic, photonic networks, which are capable of high-capacity long-haul transmission have been introduced. Optical amplifiers are used, for example, to compensate for optical loss in optical transmitters/receivers and transmission loss in long-haul optical fiber cables. Examples of optical amplifiers are optical fiber amplifiers and semiconductor optical amplifiers (SOAs). SOAs are advantageous in that SOAs may amplify optical signals of different wavelengths that are used in photonic networks, by using different materials for the SOAs. Thus, SOAs are increasingly being used in photonic networks.

Low power consumption in addition to high optical output is desired for SOAs that are used in photonic networks. SOAs obtain optical gain by using stimulated emission that occurs in the active layer when current is injected into the active layer. The optical output of SOAs is dependent on the amount of injected current. Thus, obtaining high optical output with low injected current is desirable in reducing power consumption while achieving a high optical output. That is, the energy conversion efficiency in converting electric energy, which is injected into SOAs via current to optical energy, is preferably increased.

However, the energy conversion efficiency of SOAs is significantly lower than the energy conversion efficiency of optical fiber amplifiers, which are in practical use in photonic networks.

In conventional techniques, increasing the energy conversion efficiency of SOAs sufficiently while achieving a high optical output is difficult. Although reducing the polarization dependence of optical gain in SOAs that are used in photonic network is desirable, reducing the polarization dependence of optical gain in SOAs is considerably difficult using conventional techniques.

Japanese Patent Laid-open No. 03-284892, Japanese Patent Laid-open No. 04-217382, Japanese Patent Laid-open No. 07-135372, and Japanese Patent Laid-open No. 05-067845 are examples of related art documents.

SUMMARY

According to an aspect of an embodiment, a semiconductor optical amplifier includes an n-type semiconductor layer, a p-type semiconductor layer, an active layer provided between the n-type semiconductor layer and the p-type semiconductor layer, the active layer transmitting an optical signal, and a current-injection part that injects current into the active layer via the n-type semiconductor layer and the p-type semiconductor layer, the active layer including a first active layer that includes AlGaInAs, and a second active layer that includes GaInAsP, the second active layer provided closer to an output side than the first active layer, and the first active layer and the second active layer being butt-jointed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
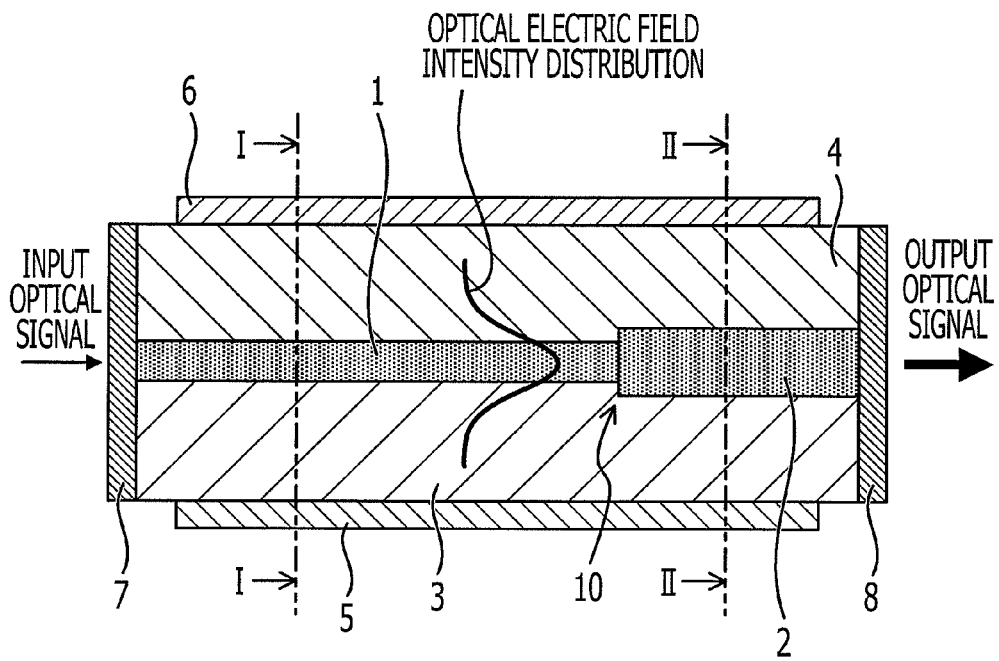
FIGS. 1A to 1C are sectional views of the structure of a semiconductor optical amplifier (SOA) according to Embodiment 1.

A relationship between the optical output and the energy conversion efficiency of a semiconductor optical amplifier (SOA) is described. The energy conversion efficiency of an optical amplifier is generally defined by the ratio of the optical energy generated in the optical amplifier, to the electric power applied to the optical amplifier. Gain saturation effect in which the optical gain decreases when the optical output of the optical amplifier is high, normally occurs in the optical amplifier. Thus, the 3-dB saturation optical output power, which is the optical output power when the optical gain decreases by 3 dB from the optical gain when the optical output is low, is used as the maximum optical output of the optical amplifier. Therefore, to define the energy conversion efficiency, the ratio of the optical energy generated in the optical amplifier at the 3-dB saturation optical output power, to the electric power applied to the optical amplifier, is more practical. A 3-dB saturation optical output power Ps of the SOA is expressed in Equation 1.

$$Ps \propto hv \cdot \frac{dw}{\Gamma} \cdot \frac{1}{\tau} \cdot \frac{1}{A_g} \qquad \text{Equation 1}$$

In Equation 1, hv is the energy of an optical signal, d is the thickness of an active layer, w is the width of the active layer, $\Gamma$ is the optical confinement factor of the active layer, $\tau$ is the carrier life time of the active layer, and $A_g$ is the differential gain factor of the active layer. To increase the saturation optical output power Ps in Equation 1, reducing the optical confinement factor $\Gamma$ or the differential gain factor $A_g$ is effective.

An energy conversion efficiency $\eta$ at the saturation optical output power Ps is expressed in Equation 2.

$$\eta \propto \frac{\Gamma g - \alpha}{\Gamma g} \qquad \text{Equation 2}$$

In Equation 2, g is the material gain of the active layer and $\alpha$ is the internal loss of the SOA. The material gain g is expressed in Equation 3 using a carrier density N and a transparency carrier density $N_0$ of the active layer.

$$g = A_g \cdot (N - N_0) \qquad \text{Equation 3}$$

Equations 2 and 3 indicate that reducing the internal loss $\alpha$, increasing the optical confinement factor $\Gamma$, or increasing the differential gain factor $A_g$ is effective in increasing the energy conversion efficiency $\eta$.

The saturation optical output power Ps and the energy conversion efficiency $\eta$ are in a trade-off relationship with respect to the optical confinement factor $\Gamma$ and the differential gain factor $A_g$. Thus, increasing the energy conversion efficiency $\eta$ while obtaining a high saturation optical output power Ps is difficult.

The saturation optical output power Ps is more subject to the effect of the structure of an output side than the structure of an input side. Thus, the energy conversion efficiency $\eta$ may be improved while obtaining a high saturation optical output power Ps, by forming the structure of the input side so that the energy conversion efficiency $\eta$ may be improved, and forming the structure of the output side so that the saturation optical output power Ps may be improved.

The embodiments are described below with reference to the accompanying drawings.

Figure 1B:
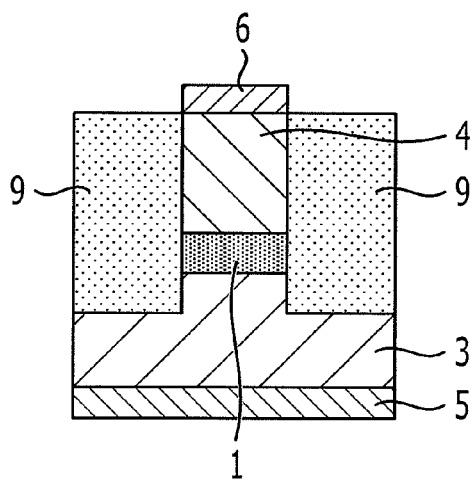
Figure 1C:
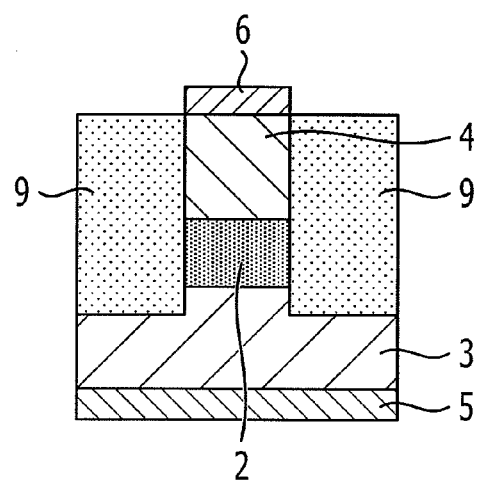

Embodiment 1 is described below. FIGS. 1A to 1C are sectional views of the structure of a semiconductor optical amplifier (SOA) according to Embodiment 1. FIG. 1B is a sectional view along a line I-I in FIG. 1A. FIG. 1C is a sectional view along a line II-II in FIG. 1A.

A waveguide that includes an AlGaInAs active layer 1 and a GaInAsP active layer 2 is formed over an n-type InP layer 3 in the SOA. A p-type InP layer 4 is formed over the AlGaInAs active layer 1 and the GaInAsP active layer 2. The waveguide that includes the AlGaInAs active layer 1 and the GaInAsP active layer 2 is provided between the n-type InP layer 3 and the p-type InP layer 4. As illustrated in FIGS. 1B and 1C, the SOA is formed as a mesa structure and a barrier layer 9 is formed on both sides of the waveguide and the p-type InP layer 4. An anti-reflection film 7 is formed at an input side and an anti-reflection film 8 is formed at an output side. The AlGaInAs active layer 1 and the GaInAsP active layer 2 are butt-jointed and a butt joint 10 is provided at an interface between the AlGaInAs active layer 1 and the GaInAsP active layer 2. The AlGaInAs active layer 1 is provided on the input side with respect to the butt joint 10, and the GaInAsP active layer 2 is provided on the output side with respect to the butt joint 10. A cathode 5 that contacts the n-type InP layer 3, and an anode 6 that contacts the p-type InP layer 4 are formed.

Figure 2A:
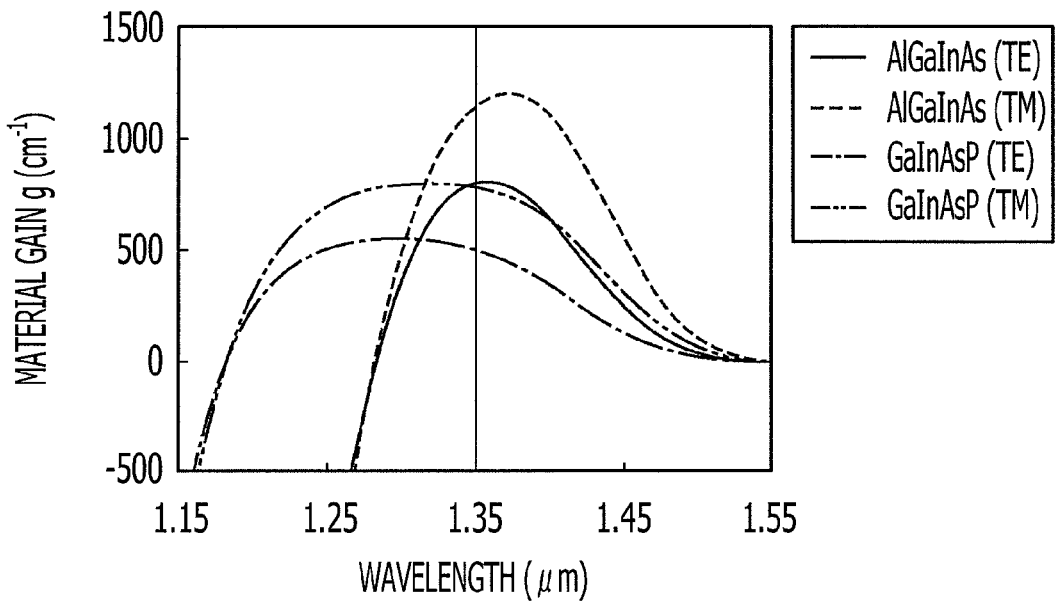
FIG. 2A is a graph illustrating a relationship between the wavelength and a material gain g according to Embodiment 1.
Figure 2B:
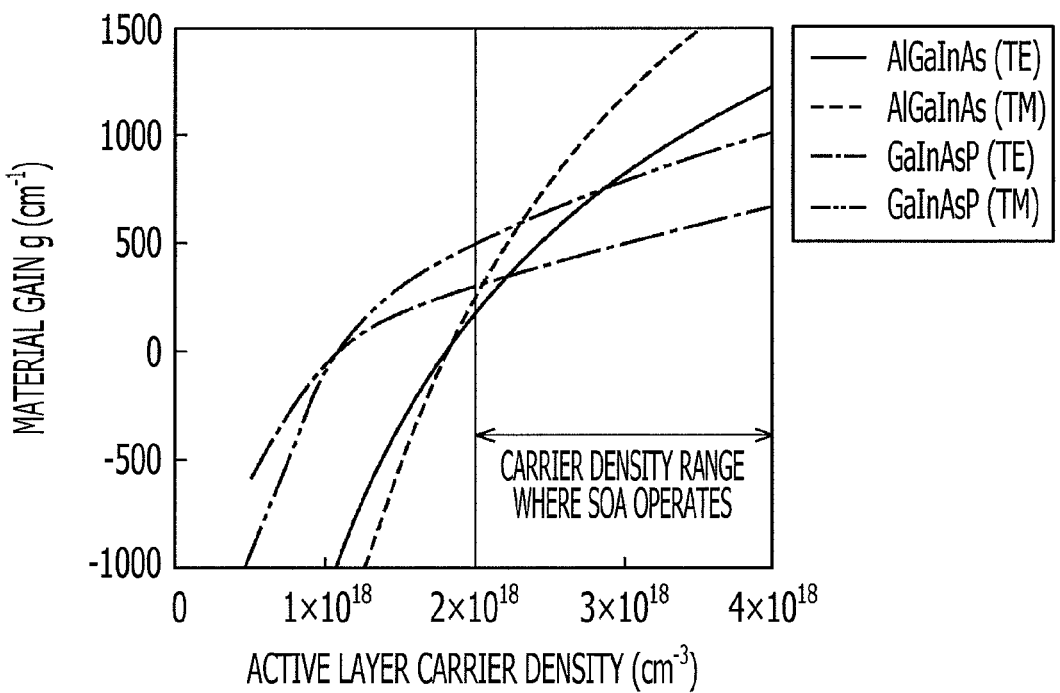
FIG. 2B is a graph illustrating a relationship between the carrier density of an active layer and the material gain g according to Embodiment 1.

The operation of the SOA is described below. Generally, the carrier density of an active layer in the SOA is not clamped at the laser oscillation threshold as in a semiconductor laser. The SOA operates at a higher carrier density than the carrier density of the semiconductor laser. The carrier density of the SOA is, for example, approximately $2 \times 10^{18}$ cm$^{-3}$ to $4 \times 10^{18}$ cm$^{-3}$. FIG. 2A is a graph illustrating a relationship between the wavelength and a material gain g. FIG. 2B is a graph illustrating a relationship between the carrier density of the active layer and the material gain g. FIG. 2A illustrates the spectrum of the material gain g of each bulk active layer formed over an InP substrate. FIG. 2B illustrates the carrier density dependence of the material gain g. The band-gap wavelengths of an AlGaInAs bulk active layer and a GaInAsP bulk active layer are 1410 nm, and the AlGaInAs bulk active layer and the GaInAsP bulk active layer are applied with a tensile strain of −0.30%.

FIG. 2A illustrates the spectrum when a carrier density N of the active layer is $3.0 \times 10^{18}$ cm$^{-3}$. The value of the carrier density N, $3.0 \times 10^{18}$ cm$^{-3}$, is in the range of the carrier density where the SOA generally operates. As illustrated in FIG. 2A, due to the difference in the effective electron mass between AlGaInAs and GaInAsP, the peak intensity of the material gain spectrum of the AlGaInAs bulk active layers that are indicated by the continuous line and the broken line is significantly higher than the peak intensity of the material gain spectrum of the GaInAsP bulk active layers that are indicated by the dashed-dotted line and the dashed two-dotted line.

FIG. 2B illustrates the carrier density dependence of the material gain g when the wavelength is 1350 nm. As illustrated in FIG. 2A, 1350 nm in wavelength is substantially close to the peak wavelength of the material gain g when the carrier density N of the active layer is $3.0 \times 10^{18}$ cm$^{-3}$. As illustrated in FIG. 2B, a transparency carrier density $N_0$ at which the absorption of the AlGaInAs bulk active layers changes to gain, is higher than the transparency carrier density $N_0$ at which the absorption of the GaInAsP bulk active layers changes to gain. However, when the carrier density N is, for example, approximately $2 \times 10^{18}$ cm$^{-3}$ to $4 \times 10^{18}$ cm$^{-3}$ at which the SOA operates, a differential gain factor $A_g$ of the AlGaInAs bulk active layers is significantly higher than the differential gain factor $A_g$ of the GaInAsP bulk active layers that is indicated by the slope of the curves. Furthermore, the material gain g of the AlGaInAs bulk active layers is higher than the material gain g of the GaInAsP bulk active layers when the carrier density N is approximately $2.5 \times 10^{18}$ cm$^{-3}$ or higher.

As described above, the AlGaInAs active layer 1 is provided on the input side with respect to the butt joint 10 and the GaInAsP active layer 2 is provided on the output side with respect to the butt joint 10. Thus, a high material gain g may be obtained by using a high differential gain factor $A_g$ when the carrier density N of the AlGaInAs active layer 1 is relatively high. A high saturation optical output power Ps may be achieved by using a low differential gain factor $A_g$ when the carrier density N of the GaInAsP active layer 2 is relatively high. Therefore, the gain per unit length of the waveguide of the AlGaInAs active layer 1 may be increased while achieving a high saturation optical output power Ps provided by the GaInAsP active layer on output side. Also, as the gain increases, the length of the active layer may be reduced and the power applied to the active layer may be reduced. Thus, power consumption may be reduced while achieving a high saturation optical output power Ps.

With regard to the design of an area between an input-side region and an output-side region, relatively few restrictions generally exist because the AlGaInAs active layer 1 and the GaInAsP active layer 2 are butt-jointed. Therefore, the structure of the AlGaInAs active layer 1, the GaInAsP active layer 2, the n-type InP layer 3, the p-type InP layer 4, and the like may be designed with a relatively high degree of freedom. Hence, the optical waveguide modes at the AlGaInAs active layer 1 and the GaInAsP active layer 2 may substantially match and the very low transition loss between AlGaInAs active layer and GaInAsP active layer can be obtained. In addition, thanks to the flexibility in design of each active layer, the polarization dependence may be reduced by adjusting the amount of strain in each active layer independently.

A method of manufacturing the SOA according to Embodiment 1 is described below. FIGS. 3A to 3G are sectional views illustrating the method of manufacturing the SOA according to Embodiment 1.

Figure 3A:
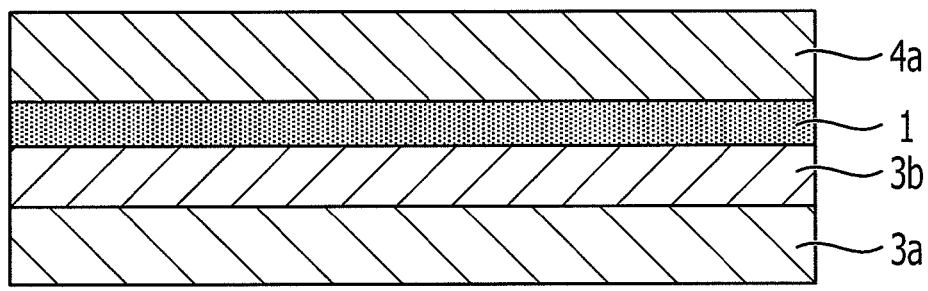
FIGS. 3A to 3G are sectional views illustrating a method of manufacturing the SOA according to Embodiment 1.

As illustrated in FIG. 3A, an n-type InP cladding layer 3b, the AlGaInAs active layer 1, and a p-type InP cladding layer 4a are formed over an n-type InP substrate 3a by, for example, metal-organic vapor-phase epitaxy (MOVPE). The thickness of the n-type InP cladding layer 3b is, for example, 1.0 μm. The AlGaInAs active layer 1 is, for example, an $Al_{0.10}Ga_{0.41}In_{0.49}As$ bulk active layer in which the thickness is 100 nm, the composition wavelength is 1.41 μm, and the tensile strain is −0.30%. The thickness of the p-type InP cladding layer 4a is, for example, 200 nm. The n-type InP cladding layer 3b is epitaxially grown over the n-type InP substrate 3a, the AlGaInAs active layer 1 is epitaxially grown over the n-type InP cladding layer 3b, and the p-type InP cladding layer 4a is epitaxially grown over the AlGaInAs active layer 1.

Figure 3B:
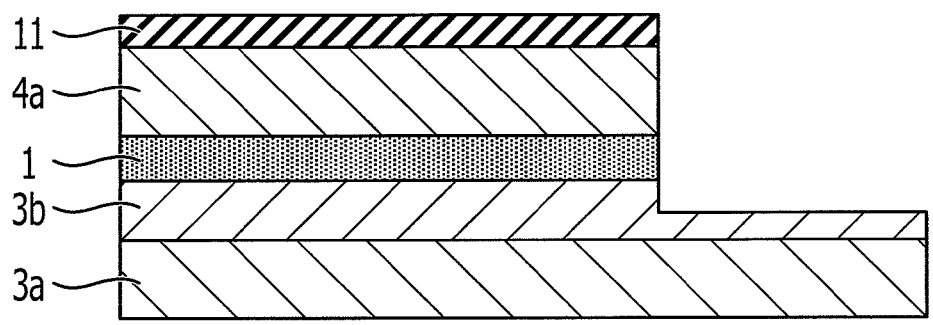

As illustrated in FIG. 3B, a mask 11 is formed over the p-type InP cladding layer 4a. The mask 11 is formed over the region of the p-type InP cladding layer 4a in which the AlGaInAs active layer 1 remains below the p-type InP cladding layer 4a. That is, the mask 11 is formed over the input-side region. The mask 11 includes, for example, Si oxide. Portions of the p-type InP cladding layer 4a, the AlGaInAs active layer 1, and the n-type InP cladding layer 3b that are exposed from the mask 11 are removed by wet etching or the like using the mask 11 as an etching mask, and the output-side region is formed.

Figure 3C:
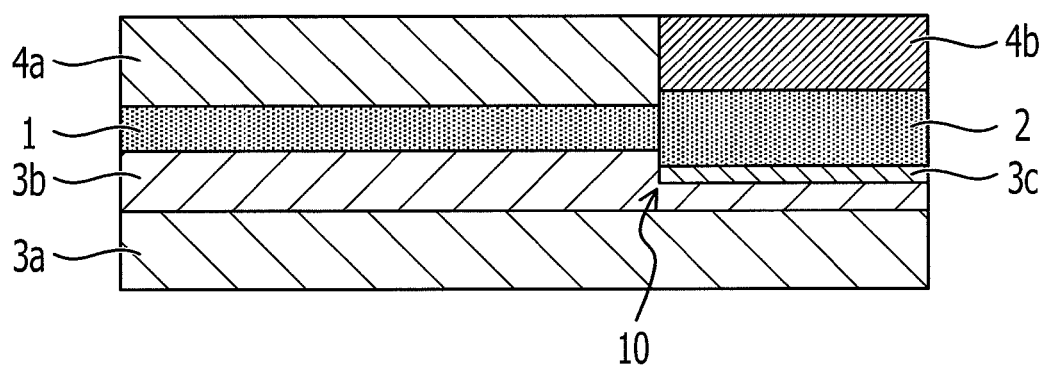

As illustrated in FIG. 3C, an n-type InP cladding layer 3c, the GaInAsP active layer 2, and the a p-type InP cladding layer 4b are formed over the n-type InP cladding layer 3b by, for example, MOVPE using the mask 11 as a selective growth mask. The GaInAsP active layer 2 is, for example, a $Ga_{0.40}In_{0.60}As_{0.77}P_{0.23}$ bulk active layer in which the thickness is 120 nm, the composition wavelength is 1.41 μm, and the tensile strain is −0.30%. The n-type InP cladding layer 3c is formed so that, for example, the total thickness of the n-type InP cladding layer 3b and the n-type InP cladding layer 3c below the GaInAsP active layer 2 is less than the thickness of the n-type InP cladding layer 3b below the AlGaInAs active layer 1. The GaInAsP active layer 2 is formed by MOVPE butt-joint growth and the butt joint 10 is provided between the AlGaInAs active layer 1 and the GaInAsP active layer 2. For example, the p-type InP cladding layer 4b is formed so that the p-type InP cladding layer 4a and the p-type InP cladding layer 4b form a substantially level surface. The mask 11 is removed. The n-type InP layer 3 (not illustrated) includes the n-type InP substrate 3a, the n-type InP cladding layer 3b, and the n-type InP cladding layer 3c.

Figure 3D:
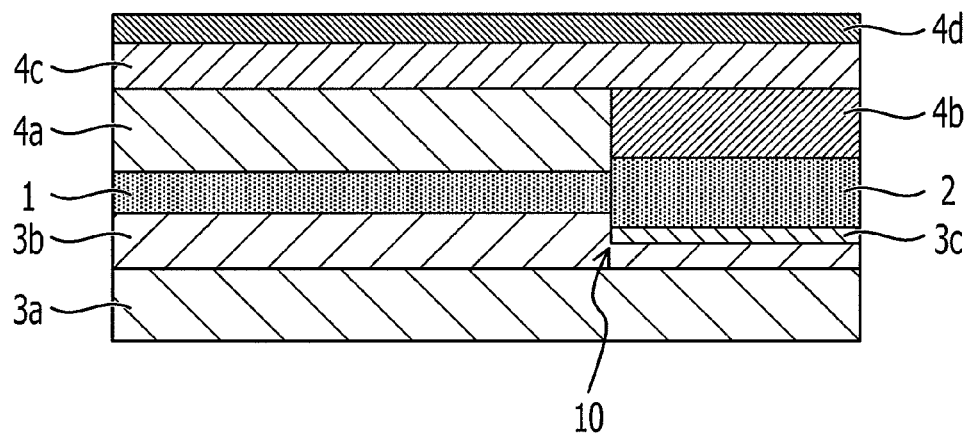

As illustrated in FIG. 3D, a p-type InP cladding layer 4c and a p-type GaInAs contact layer 4d are formed over the p-type InP cladding layer 4a and the p-type InP cladding layer 4b by, for example, MOVPE. The thickness of the p-type InP cladding layer 4a is, for example, 2.0 μm, and the thickness of the p-type GaInAs contact layer 4d is, for example, 500 nm. The p-type InP layer 4 (not illustrated) includes the p-type InP cladding layer 4a, the p-type InP cladding layer 4b, and the p-type InP cladding layer 4c.

Figure 3E:
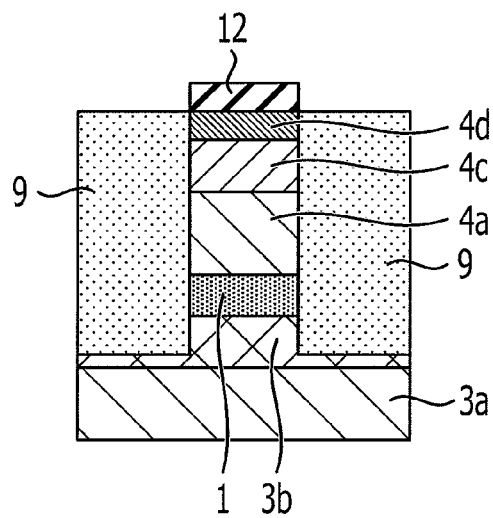
Figure 3F:
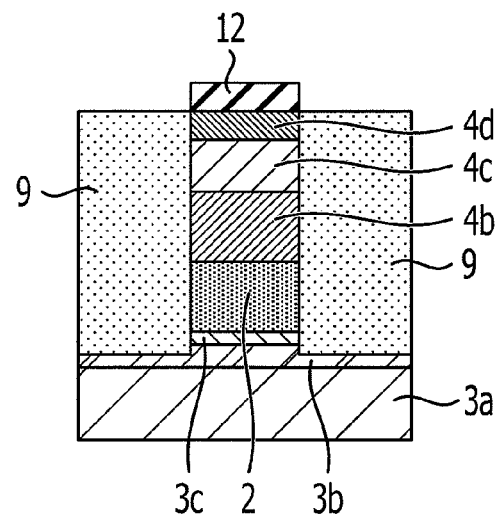

As illustrated in FIGS. 3E and 3F, a mask 12 that extends from an input port to an output port is formed over the p-type GaInAs contact layer 4d along the waveguide. The mask 12 may include, for example, Si oxide. Portions of the p-type GaInAs contact layer 4d, the p-type InP cladding layer 4a, the p-type InP cladding layer 4b, the p-type InP cladding layer 4c, the AlGaInAs active layer 1, the GaInAsP active layer 2, the n-type InP cladding layer 3b, and the n-type InP cladding layer 3c that are exposed from the mask 12 are removed by wet etching using the mask 12 as the etching mask, and a waveguide mesa structure is formed. The barrier layer 9 is formed on both sides of the waveguide mesa structure. As a result, a current confinement structure is formed on both sides of the waveguide mesa structure. For example, a regrowth of a high-resistance semi-insulating (SI) InP barrier layer is conducted in forming the barrier layer 9. The mask 12 is removed.

Figure 3G:
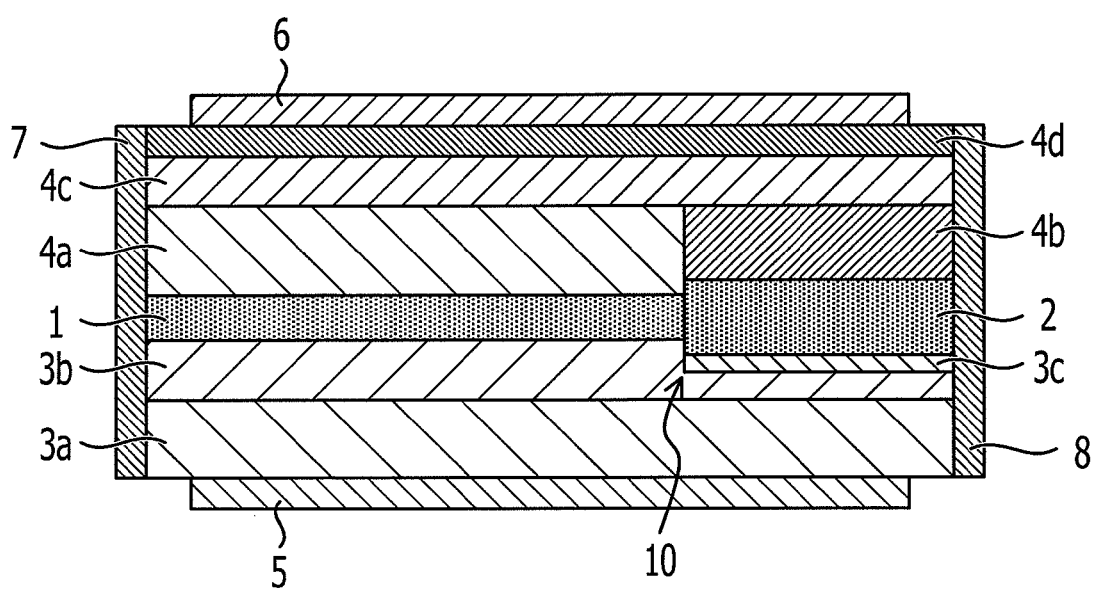

As illustrated in FIG. 3G, the cathode 5 is formed over the n-type InP substrate 3a and the anode 6 is formed over the p-type GaInAs contact layer 4d. A cleaving process is conducted on the input and output ports, the anti-reflection film 7 is formed at the input side, and the anti-reflection film 8 is formed at the output side. For example, the length of the SOA from the input port to the output port is 600 μm, the length of the AlGaInAs active layer 1 is 400 μm, and the length of the GaInAsP active layer 2 is 200 μm.

Figure 4:
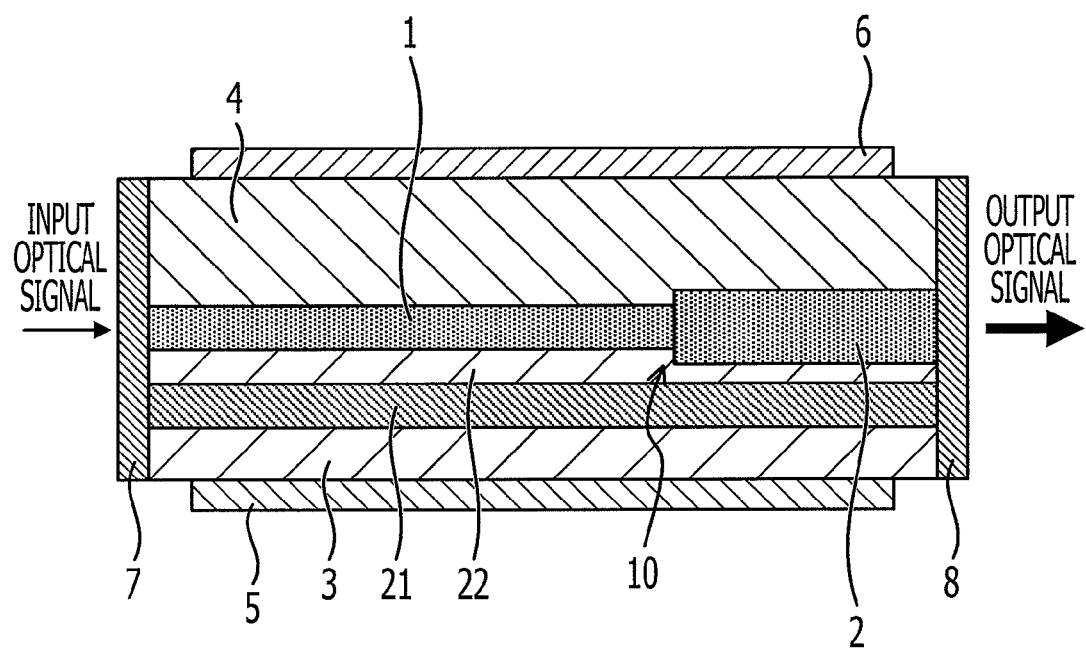
FIG. 4 is a sectional view of the structure of a semiconductor optical amplifier (SOA) according to Embodiment 2.

Embodiment 2 is described below. FIG. 4 is a sectional view of the structure of a semiconductor optical amplifier (SOA) according to Embodiment 2.

As illustrated in FIG. 4, an n-type InP layer 22 and a guide layer 21 having a longer bandgap wavelength than an n-type InP layer 3, a shorter bandgap wavelength than an AlGaInAs active layer 1, and a shorter band-gap wavelength than a GaInAsP active layer 2, are formed between the n-type InP layer 3 and the AlGaInAs active layer 1, and the n-type InP layer 3 and the GaInAsP active layer 2. The guide layer 21 is formed between the n-type InP layer 3 and the n-type InP layer 22. The guide layer 21 is, for example, an n-type GaInAsP layer with a bandgap wavelength of 1.1 μm. The thickness of the guide layer 21 is 500 nm. The bandgap wavelength and the material of the n-type InP layer 22 is, for example, substantially the same as the composition wavelength and the material of the n-type InP layer 3. The thickness of the n-type InP layer 22 is 100 nm. Descriptions of the elements in Embodiment 2, which are substantially equivalent to the elements in Embodiment 1, have been omitted.

Due to the guide layer 21, the gain and the noise factor may be improved and a saturation optical output power Ps may be increased by reducing an internal loss $\alpha_i$ (i=1 or 2) of a waveguide. The guide layer 21 may contact the waveguide, which includes the AlGaInAs active layer 1 and the GaInAsP active layer 2.

Figure 5:
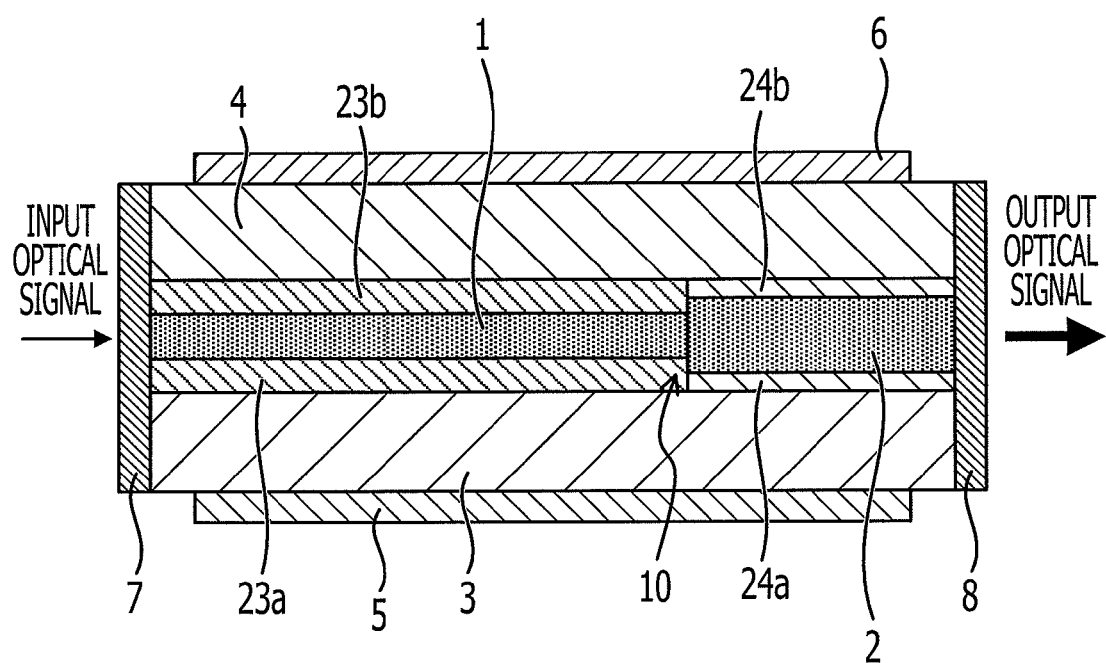
FIG. 5 is a sectional view of the structure of a semiconductor optical amplifier (SOA) according to Embodiment 3.

Embodiment 3 is described below. FIG. 5 is a sectional view of the structure of a semiconductor optical amplifier (SOA) according to Embodiment 3.

As illustrated in FIG. 5, an AlGaInAs separate-confinement-heterostructure (SCH) layer 23a is formed between an n-type InP layer 3 and an AlGaInAs active layer 1, and an AlGaInAs separate-confinement-heterostructure (SCH) layer 23b is formed between a p-type InP layer 4 and the AlGaInAs active layer 1. A GaInAsP separate-confinement-heterostructure (SCH) layer 24a is formed between the n-type InP layer 3 and a GaInAsP active layer 2. A GaInAsP separate-confinement-heterostructure (SCH) layer 24b is formed between the p-type InP layer 4 and the GaInAsP active layer 2. The AlGaInAs SCH layers 23a and 23b are, for example, i-AlGaInAs layers with a composition wavelength of 1.2 µm. The thickness of the AlGaInAs SCH layers 23a and 23b are each 100 nm. The GaInAsP SCH layers 24a and 24b are, for example, i-GaInAsP layers with a composition wavelength of 1.2 µm. The thickness of the GaInAsP SCH layers 24a and 24b are each 50 nm. Descriptions of the elements in Embodiment 3, which are substantially equivalent to the elements in Embodiment 1, have been omitted.

Due to the AlGaInAs SCH layers 23a and 23b, and the GaInAsP SCH layers 24a and 24b, carriers may be confined in a waveguide relatively easily, and the gain and the noise factor may be improved because the carrier density of an active layer increases.

Figure 6A:
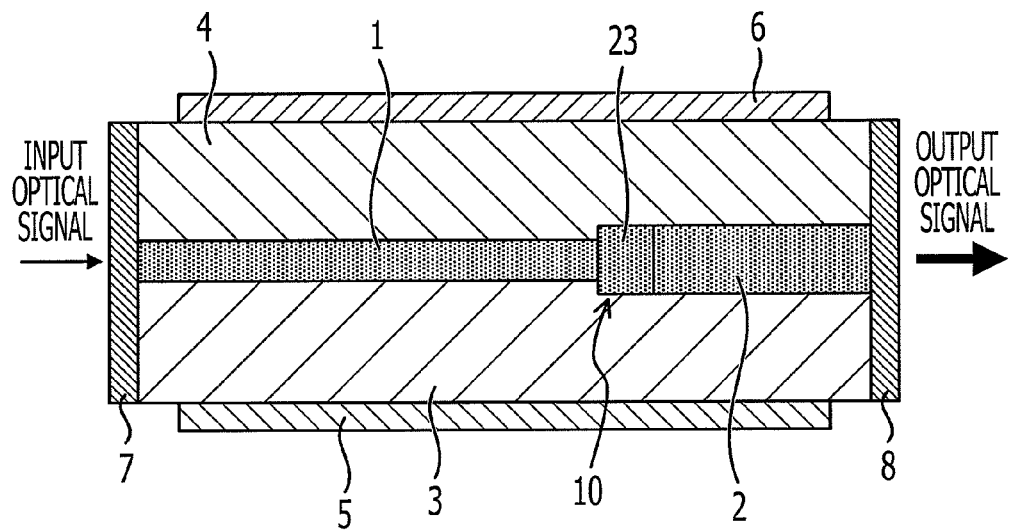
FIG. 6A illustrates the structure of a semiconductor optical amplifier (SOA) according to Embodiment 4.

Embodiment 4 is described below. FIG. 6A illustrates the structure of a semiconductor optical amplifier (SOA) and FIG. 6B illustrates the conduction band potential in the SOA according to Embodiment 4.

As illustrated in FIG. 6A, a barrier layer 23 is formed at a butt joint 10. That is, the barrier layer 23 is formed between an AlGaInAs active layer 1 and a GaInAsP active layer 2. The barrier layer 23 is butt-jointed to the AlGaInAs active layer 1 and the GaInAsP active layer 2. The barrier layer 23 includes, for example, InP, InAlAs, InGaP, GaAs, or AlGaInAs. InAlAs or InGaP in which the composition is adjusted so that the conduction band energy level of InAlAs or InGaP is higher than the conduction band energy level of the AlGaInAs active layer 1 and the GaInAsP active layer 2, is used. Descriptions of the elements in Embodiment 4, which are substantially equivalent to the elements in the Embodiment 1, have been omitted.

Figure 6B:
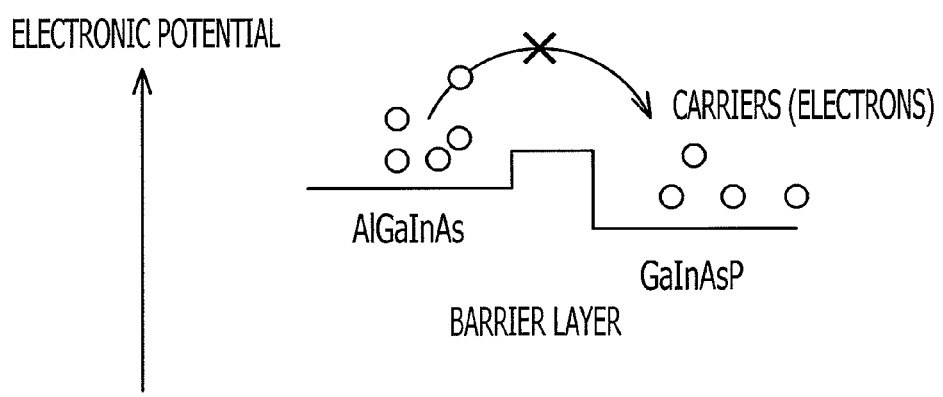
FIG. 6B illustrates the conduction band potential in the SOA according to Embodiment 4.

As illustrated in FIG. 6B, electron diffusion, which is generated by an offset between the conduction band potential of the AlGaInAs active layer 1 and the GaInAsP active layer 2, may be suppressed. Thus, the uniformity of the carrier density between the AlGaInAs active layer 1 and the GaInAsP active layer 2 may be improved, and the SOA with a higher performance may be realized.

The length of the barrier layer 23 in the direction that an optical signal is transmitted, is preferably, for example, 5 nm or longer so that a tunneling conduction of electrons does not occur.

Figure 7A:
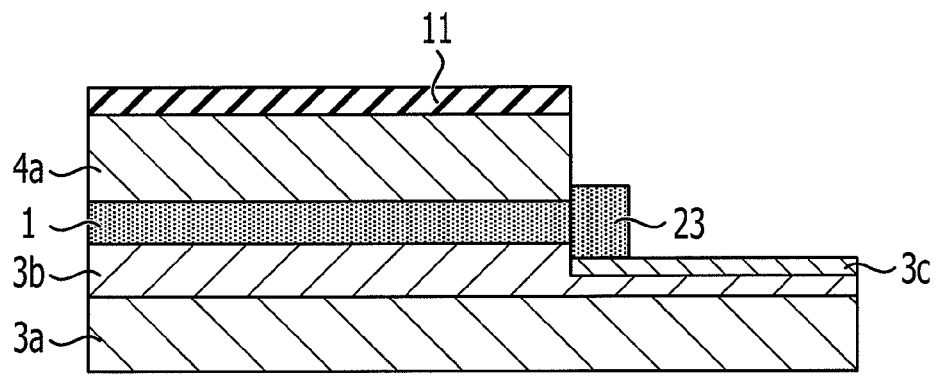
FIGS. 7A to 7C are sectional views illustrating the first method of manufacturing the SOA according to Embodiment 4.
Figure 7B:
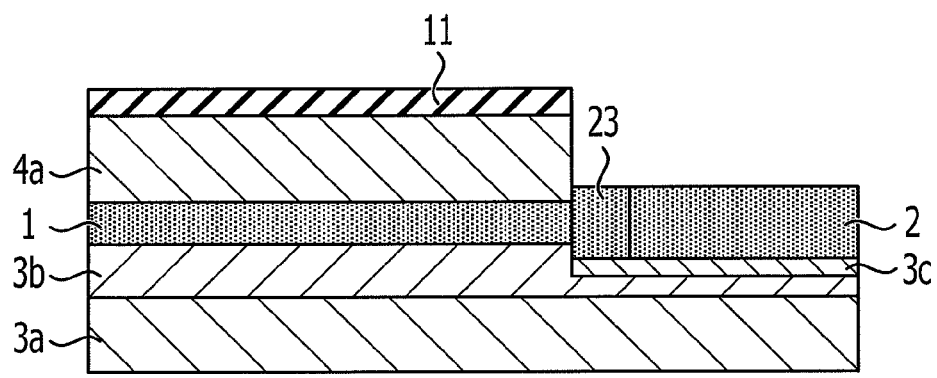
Figure 7C:
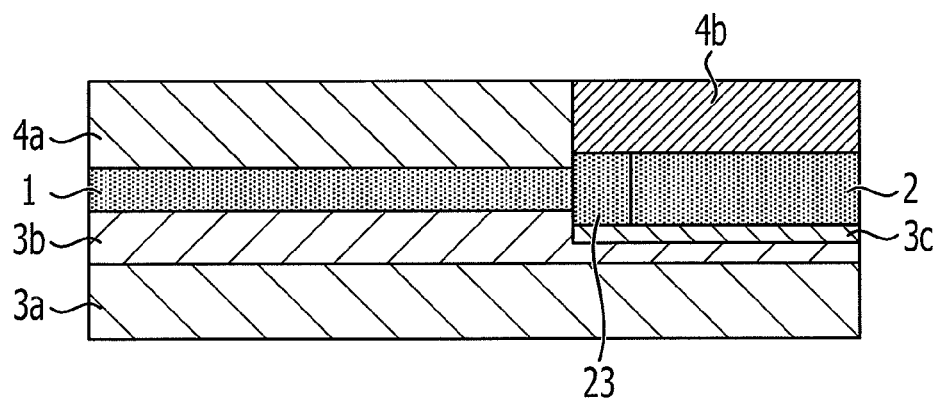
Figure 8A:
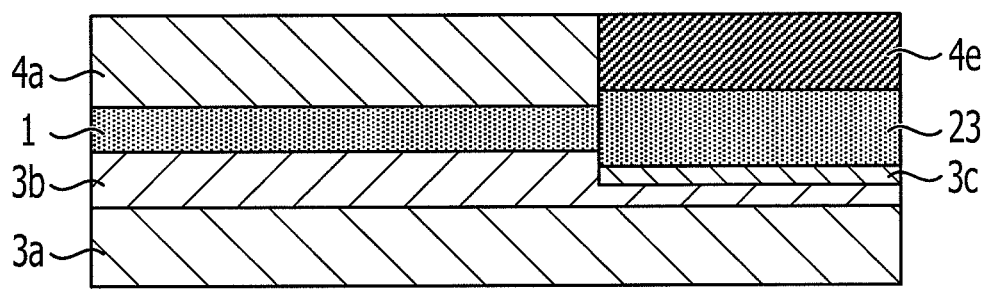
FIGS. 8A to 8C are sectional views illustrating the second method of manufacturing the SOA according to Embodiment 4.
Figure 8B:
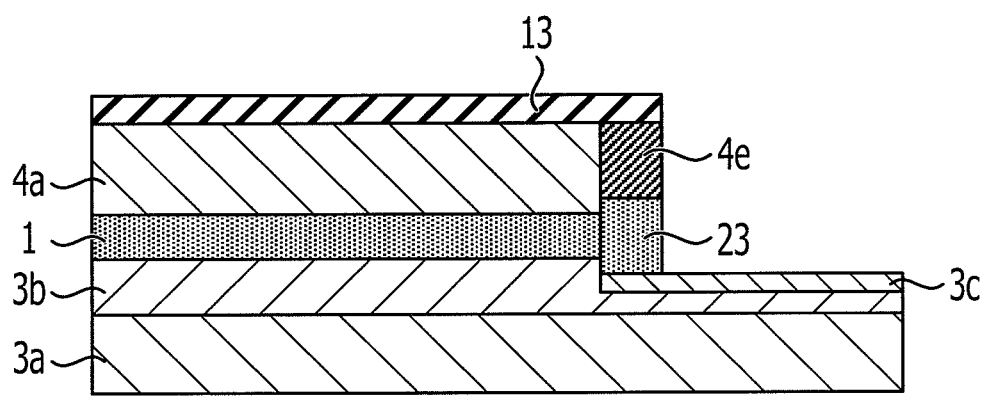
Figure 8C:
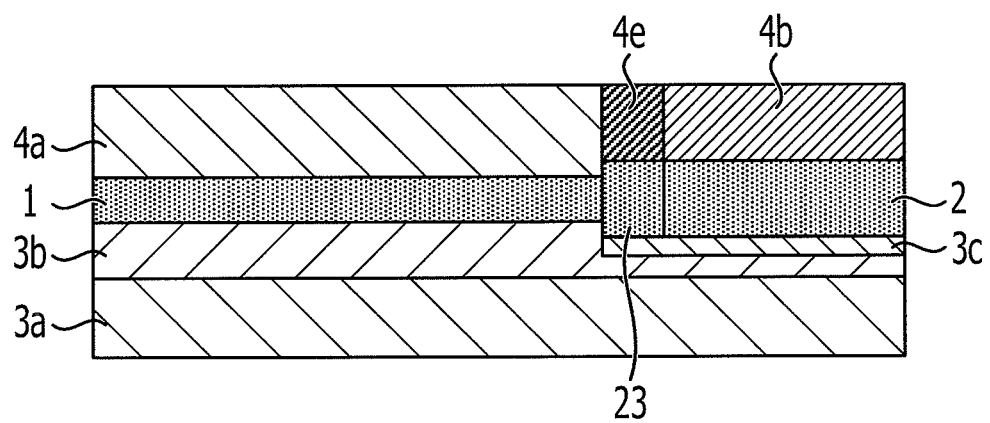

FIGS. 7A to 7C are sectional views illustrating the first method of manufacturing the SOA according to Embodiment 4. FIGS. 8A to 8C are sectional views illustrating the second method of manufacturing the SOA according to Embodiment 4.

As illustrated in FIG. 7A, an output-side region is formed by using a mask 11 as an etching mask in the first method, as in Embodiment 1. An n-type InP cladding layer 3c and the barrier layer 23 are formed over an n-type InP cladding layer 3b by, for example, metal-organic vapor-phase epitaxy (MOVPE) using the mask 11 as a growth mask. The barrier layer 23 is formed by MOVPE butt-joint growth. The barrier layer 23 that is butt-jointed to the AlGaInAs active layer 1 may be locally grown only at the butt-joint surface to the AlGaInAs active layer by adjusting the growth conditions of MOVPE. In the process of selective growth of the barrier layer 23, a very thin film of barrier layer is also formed over the n-type InP cladding layer 3c (not shown).

As illustrated in FIG. 7B, the GaInAsP active layer 2 is formed over the n-type InP cladding layer 3c by, for example, MOVPE, using the mask 11 as the growth mask. The GaInAsP active layer 2 is formed by MOVPE butt-joint growth.

As illustrated in FIG. 7C, a p-type InP cladding layer 4b is formed over the barrier layer 23 and the GaInAsP active layer 2 by, for example, MOVPE. A p-type InP cladding layer 4c (not illustrated) is formed. Descriptions of the processes following the formation of the p-type InP cladding layer 4c, which are substantially equivalent to the processes in Embodiment 1, have been omitted.

As illustrated in FIG. 8A, the output-side region is formed by using the mask 11 (not illustrated) as the etching mask in the second method, as in Embodiment 1. The n-type InP cladding layer 3c, the barrier layer 23, and a p-type InP cladding layer 4e are formed over the n-type InP cladding layer 3b by, for example, MOVPE, using the mask 11 as the growth mask. The barrier layer 23 is formed by MOVPE butt-joint growth. The mask 11 is removed.

As illustrated in FIG. 8B, a mask 13 is formed over the AlGaInAs active layer 1 and the barrier layer 23 via a p-type InP cladding layer 4a and the p-type InP cladding layer 4e. The mask 13 includes, for example, Si oxide. Portions of the p-type InP cladding layer 4e and the barrier layer 23 that are exposed from the mask 13 are removed by wet etching or the like using the mask 13 as the etching mask.

As illustrated in FIG. 8C, the GaInAsP active layer 2 and the p-type InP cladding layer 4b are formed over the n-type InP cladding layer 3c by, for example, MOVPE using the mask 13 (not illustrated) as the growth mask. The GaInAsP active layer 2 is formed by MOVPE butt-joint growth. The mask 13 is removed and the p-type InP cladding layer 4c (not illustrated) is formed. Descriptions of the processes following the formation of the p-type InP cladding layer 4c, which are substantially equivalent to the processes in Embodiment 1, have been omitted.

Specifically, in the first method, a thin film of barrier layer, which may impede the current injected into the GaInAsP active layer 2, is formed between the n-type InP cladding layer 3c and the GaInAsP active layer 2, as the barrier layer 23 is formed. However, in the second method, formation of the barrier layer that may impede the current injected into the GaInAsP active layer 2 may be suppressed.

Figure 9:
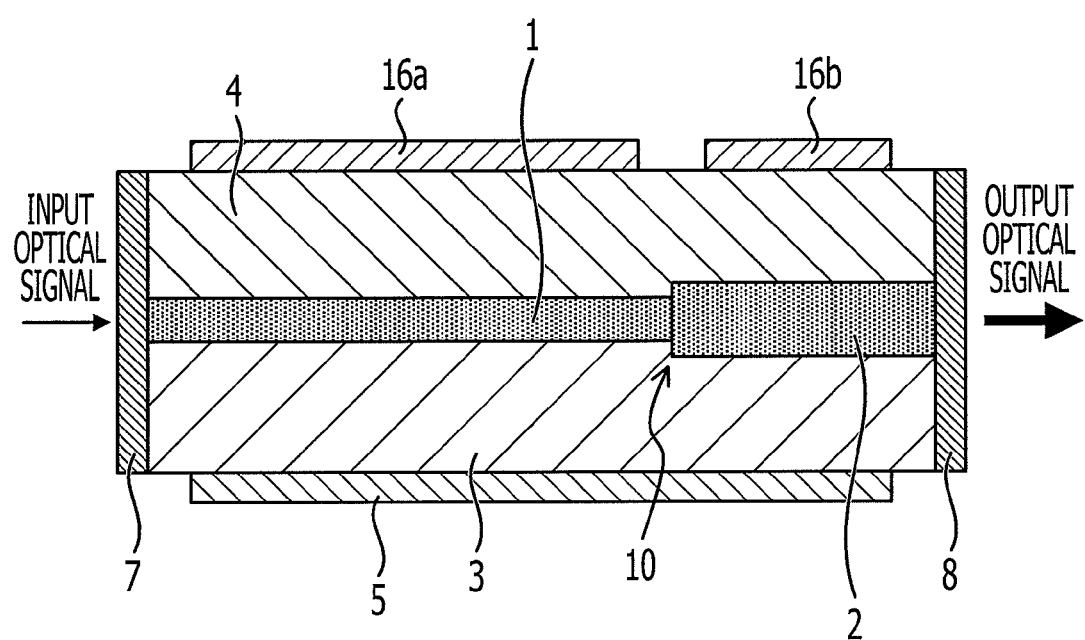
FIG. 9 is a sectional view of the structure of a semiconductor optical amplifier (SOA) according to Embodiment 5.

Embodiment 5 is described below. FIG. 9 is a sectional view of the structure of a semiconductor optical amplifier (SOA) according to Embodiment 5.

As illustrated in FIG. 9, an anode 16a of an input-side region, and an anode 16b of an output-side region that are insulated from each other, are provided in place of the anode 6 in Embodiment 1. The anode 16a is provided over an AlGaInAs active layer 1 and the anode 16b is provided over a GaInAsP active layer 2. Descriptions of the elements in Embodiment 5, which are substantially equivalent to the elements in Embodiment 1, have been omitted.

Current may be injected into the AlGaInAs active layer 1 and the GaInAsP active layer 2 independently. The AlGaInAs active layer 1 contributes mainly in increasing a material gain g. However, since the material gain g becomes saturated at a given current value, the material gain g hardly increases even when the amount of injected current is increased. The GaInAsP active layer 2 contributes mainly in increasing a saturation optical output power Ps and the saturation optical output power Ps is hardly saturated with respect to the amount of injected current. Thus, the saturation optical output power Ps may be increased efficiently by injecting the amount of current enough to saturate material gain g into the region between the anode 16a and a cathode 5, and injecting the amount of current higher than the amount of current injected into the region between the anode 16a and the cathode 5, into the region between the anode 16b and the cathode 5. Also, the gain of the SOA may be efficiently adjusted by adjusting the amount of current that is injected into the AlGaInAs active layer 1 depending on the input and output light intensity. The gain of the SOA in Embodiment 5 may be adjusted with smaller changes in the driving current since a differential gain factor $A_g$ of the AlGaInAs active layer 1 is higher than the SOA with a waveguide that includes only GaInAsP and one anode.

Figure 10:
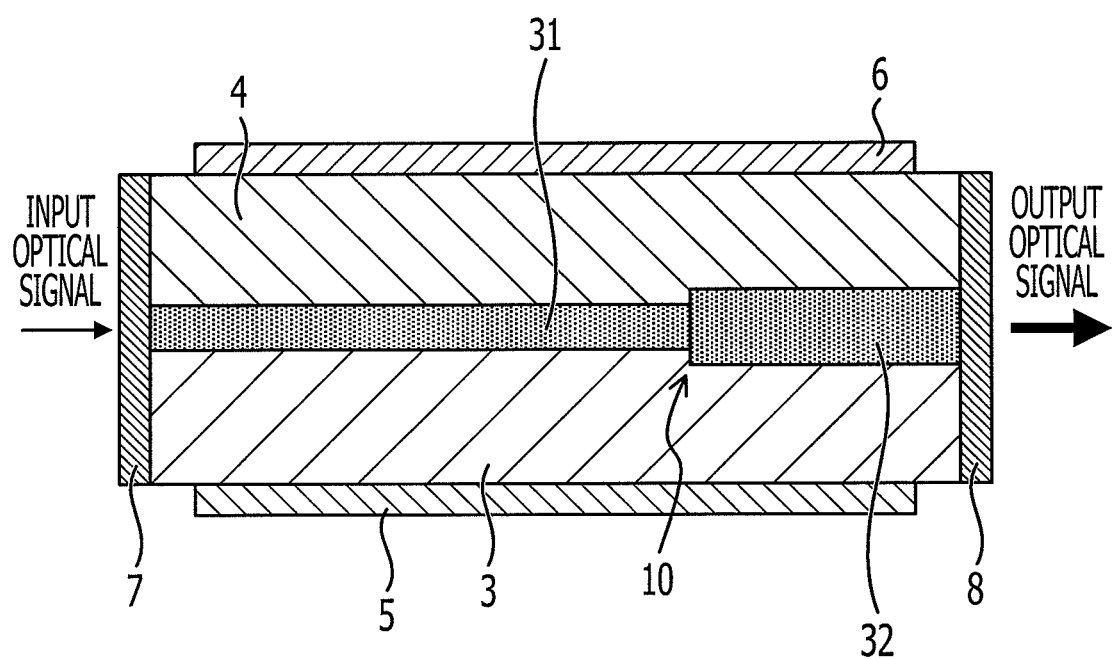
FIG. 10 is a sectional view of the structure of a semiconductor optical amplifier (SOA) according to Embodiment 6.

Embodiment 6 is described below. FIG. 10 is a sectional view of the structure of a semiconductor optical amplifier (SOA) according to Embodiment 6.

An AlGaInAs multi-quantum-well (MQW) active layer 31 is formed in Embodiment 6, in place of the AlGaInAs active layer 1 in Embodiments 1, 2, 3, 4, and 5, and a GaInAsP multi-quantum-well (MQW) active layer 32 is formed in Embodiment 6, in place of the GaInAsP active layer 2 in Embodiments 1, 2, 3, 4, and 5. For example, an AlGaInAs well layer in which the tensile strain is 0% and the thickness is 5 nm, and an AlGaInAs barrier layer in which the tensile strain is −0.8% and the thickness is 10 nm are alternately stacked ten times in the AlGaInAs MQW active layer 31. The photoluminescence (PL) wavelength of the AlGaInAs MQW active layer 31 is, for example, 1.31 μm. For example, a GaInAsP well layer in which the tensile strain is 0% and the thickness is 5 nm, and a GaInAsP barrier layer in which the tensile strain is −0.8% and the thickness is 10 nm are alternately stacked ten times in the GaInAsP MQW active layer 32. The PL wavelength of the GaInAsP MQW active layer 32 is, for example, 1.36 μm. Descriptions of the elements in Embodiment 6, which are substantially equivalent to the elements in Embodiment 1, have been omitted.

Figure 11A:
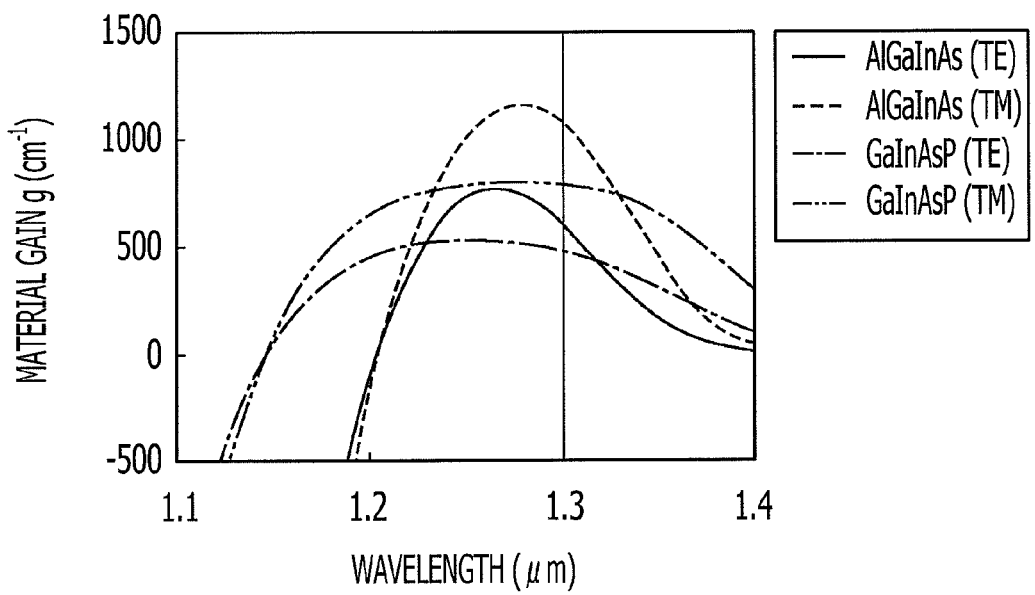
FIG. 11A is a graph illustrating a relationship between the wavelength and a material gain g according to Embodiment 6.
Figure 11B:
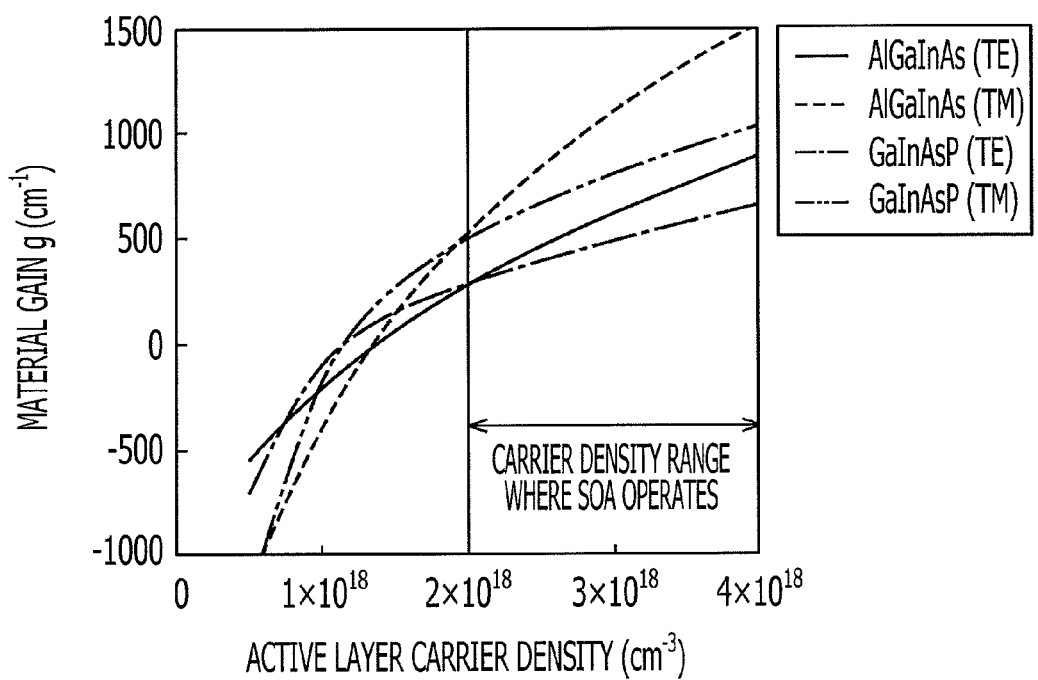
FIG. 11B is a graph illustrating a relationship between the carrier density of an active layer and the material gain g according to Embodiment 6.

FIG. 11A is a graph illustrating a relationship between the wavelength and a material gain g. FIG. 11B is a graph illustrating a relationship between the carrier density of an active layer and the material gain g. FIG. 11A illustrates the spectrum of the material gain g of the AlGaInAs MQW active layer 31 and the GaInAsP MQW active layer 32 that are formed over an InP substrate. FIG. 11B illustrates the carrier density dependence of the material gain g.

FIG. 11A illustrates the spectrum when a carrier density N of the active layer is $3.0 \times 10^{18}$ cm$^{-3}$. The value of the carrier density N, $3.0 \times 10^{18}$ cm$^{-3}$, is in the range of the carrier density where the SOA generally operates. As illustrated in FIG. 11A, due to the differences in the effective electron masses and the band offset coefficients between AlGaInAs and GaInAsP, the peak intensity of the material gain spectrum of the AlGaInAs MQW active layers 31 that are indicated by the continuous line and the broken line is significantly higher than the peak intensity of the material gain spectrum of the GaInAsP MQW active layers 32 that are indicated by the dashed-dotted line and the dashed two-dotted line, as illustrated in FIG. 2A in Embodiment 1.

FIG. 11B illustrates the carrier density dependence when the wavelength is 1300 nm. As illustrated in FIG. 11A, 1300 nm in wavelength is substantially close to the peak wavelength of the material gain g when the carrier density N of the active layer is $3.0 \times 10^{18}$ cm$^{-3}$. As illustrated in FIG. 11B, at a carrier density N of, for example, approximately $2 \times 10^{18}$ cm$^{-3}$ to $4 \times 10^{18}$ cm$^{-3}$ where the SOA operates, a differential gain factor $A_g$ of the AlGaInAs MQW active layers 31 is significantly higher than the differential gain factor $A_g$ of the GaIn-AsP MQW active layers 32 that are indicated by the slope of the curves, as illustrated in FIG. 2B in Embodiment 1.

Thus, a high material gain g may be obtained by using a high differential gain factor $A_g$ when the carrier density N of the AlGaInAs MQW active layer 31 is high, as in Embodiment 1. A high saturation optical output power Ps may be achieved by using a low differential gain factor $A_g$ when the carrier density N of the GaInAsP MQW active layer 32 is high. Therefore, power consumption may be reduced while achieving a high saturation optical output power Ps as in Embodiment 1.

The performance of the SOA in Embodiment 6 is higher than the performance of the SOA in Embodiment 1 because, for example, the rising edge of the material gain g of the AlGaInAs MQW active layer 31 and the GaInAsP MQW active layer 32 in Embodiment 6 is steeper at a low carrier density N than the rising edge of the material gain g of the AlGaInAs bulk active layer and the GaInAsP bulk active layer at a low carrier density N in Embodiment 1.

The composition wavelength of the active layers in Embodiment 1, 2, 3, 4, 5, and 6 may be adjusted, depending on the desired gain wavelength band. The composition wavelength of the two active layers that are included in a waveguide may be different. An Al composition x of an $Al_xGa_yIn_{(1-x-y)}As$ active layer is preferably 0.05 or more and 0.5 or lower because the characteristics in FIGS. 2A and 2B, and FIGS. 11A and 11B may be obtained relatively easier in an optical communication wavelength band.

Also, due to the tensile strain applied to the active layers, a polarization-independent gain may be achieved by adjusting the energy level of a heavy hole and a light hole in the active layers. The amount of tensile strain may be adjusted in the range of, for example, 0 to −1.0%. The amount of tensile strain that is applied to the two active layers in the waveguide may be different.

Although the thickness of the two active layers in the waveguide is preferably different so that the optical waveguide mode of the two active layers matches more closely, the thickness of the two active layers may be the same. The length of the two active layers may be of any length. When a higher optical output power is desired, an optical confinement factor F is preferably reduced. When the optical confinement factor F is reduced, a GaInAsP active layer is preferably longer than an AlGaInAs active layer because a region where a gain saturation occurs is relatively large. When a higher optical gain is desired, the optical confinement factor F is preferably increased. When the optical confinement factor F is increased, the AlGaInAs active layer is preferably longer than the GaInAsP active layer because the region where the gain saturation occurs is relatively small. With regard to the range of the optical output power and the optical gain desired in a semiconductor optical amplifier (SOA) in a photonic network, the length of the GaInAsP active layer is preferably 50 μm or longer.

The active layers may include N or Sb, or N and Sb, in place of AlGaInAs and GaInAsP. Although both the AlGaInAs MQW active layer 31 and the GaInAsP MQW active layer 32 have a quantum well structure in Embodiment 6, either the AlGaInAs MQW active layer 31 or the GaInAsP MQW active layer 32 may have the quantum well structure.

Figure 12:
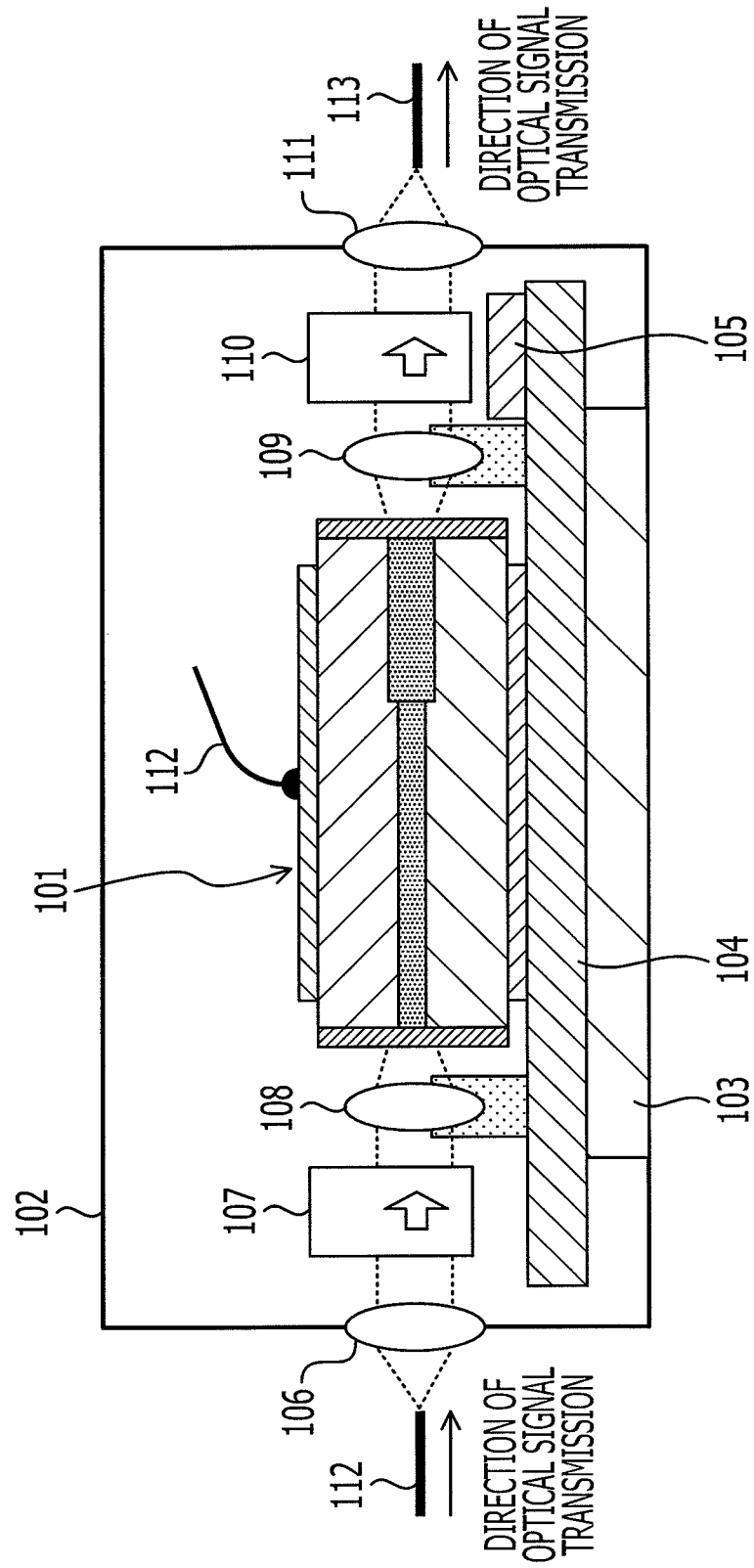
FIG. 12 illustrates the structure of an optical module according to Embodiment 7.

Embodiment 7 is described below. An optical module in Embodiment 7 includes the semiconductor optical amplifier (SOA) in Embodiment 1. FIG. 12 illustrates the structure of the optical module according to Embodiment 7.

The cathode 5 (not illustrated) of a semiconductor optical amplifier (SOA) 101 in Embodiment 1 is soldered over a chip carrier 104 that includes aluminum nitride or the like with a high thermal conductivity, by using an AuSn solder or the like. A gold wire 112 is coupled to the anode 6 (not illustrated) of the SOA 101. The gold wire 112 is also electrically coupled to a conducting pin (not illustrated) provided in a module housing 102. The cathode 5 (not illustrated) is coupled by the AuSn solder or the like to an electrode (not illustrated), which is provided over the chip carrier 104. The electrode (not illustrated) is also coupled to the conducting pin in the module housing 102 via a gold wire or the like. Thus, current may be applied to the SOA 101 via the conducting pin (not illustrated) in the module housing 102.

A thermistor 105, which detects the temperature of the SOA 101, is provided over the chip carrier 104. The chip carrier 104 is fixed to the module housing 102 via a Peltier element 103. The Peltier element 103 radiates heat that is generated when current is applied to the SOA 101, from the module housing 102. A driving current of the Peltier element 103 is controlled by an external control device or the like when the optical module is operating so that the temperature detected by the thermistor 105 is in a given range.

An optical signal to be amplified is transmitted from an input optical fiber cable 112, which is coupled to the module housing 102, and the optical signal optical-coupled to an input port of the SOA 101 via a lens 106, an optical isolator 107, and a lens 108. The optical signal that is amplified is transmitted from an output port of the SOA 101 and is optical-coupled to an output optical fiber cable 113, which is coupled to the module housing 102 via a lens 109, an optical isolator 110, and a lens 111. As described above, an optical system in which two lenses are confocally arranged on each of an input side and an output side, is employed. Optical isolators are provided in the collimated beam regions between the two lenses on each of the input side and the output side, and a reflected optical signal that is generated outside the SOA 101 and the module housing 102 are blocked. An AlGaInAs active layer 1 is provided on the input side and a GaInAsP active layer 2 is provided on the output side in the SOA 101.

The SOA in Embodiment 2, 3, 4, 5 or 6 may be used as the SOA 101 in Embodiment 7. When two anodes are used, as the anodes 16a and 16b in Embodiment 5, the gold wire is coupled to each anode and each gold wire is coupled to the conducting pins. That is, due to the structure described above, the current injected into the AlGaInAs active layer 1 and the GaInAsP active layer 2 from outside the module housing 102, may be controlled independently.

The material and the shape of the chip carrier 104, the Peltier element 103, the thermistor 105, and the like are not limited to the material and the shape described above. The method of optical coupling that uses the input optical fiber cable and the output optical fiber cable is not limited to the method of optical coupling described above. For example, one lens may be provided on each of the input side and the output side and a lensed fiber may be used. Also, the optical isolators may be omitted.

Figure 13:
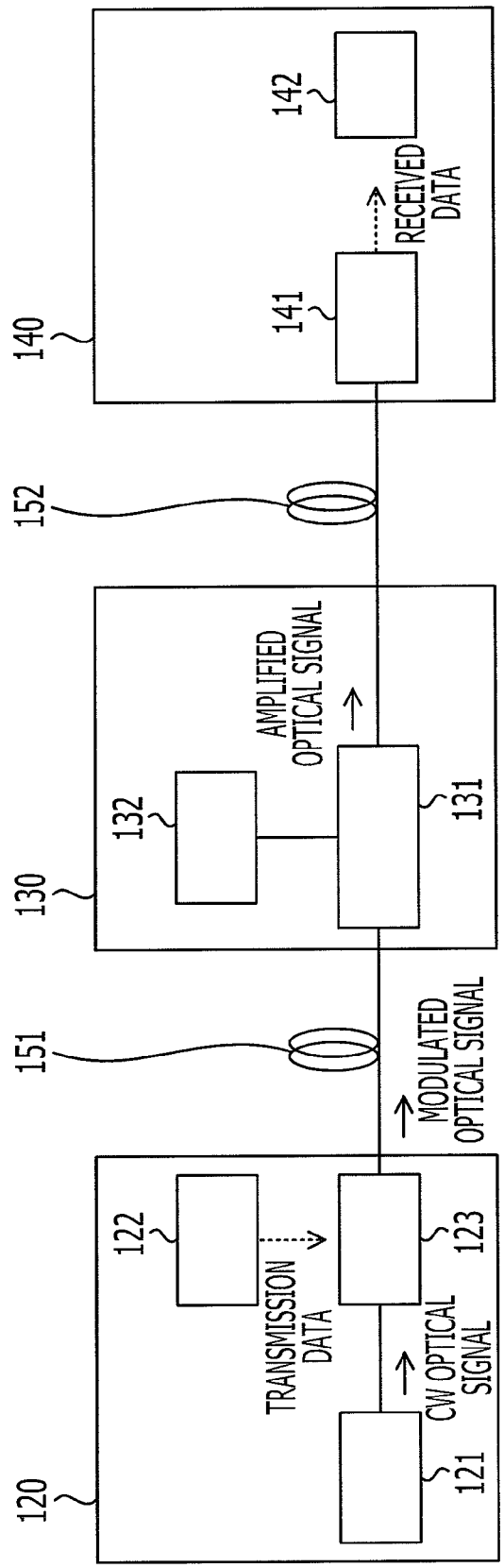
FIG. 13 illustrates the configuration of an optical communication system according to Embodiment 8.

Embodiment 8 is described below. An optical communication system in Embodiment 8 includes the optical module in Embodiment 7. FIG. 13 illustrates the configuration of the optical communication system according to Embodiment 8.

An optical transmitter 120 and an optical repeater 130 are coupled via an optical fiber transmission line 151, and the optical repeater 130 and an optical receiver 140 are coupled via an optical fiber transmission line 152 in the optical communication system.

A laser light source 121, a transmitting circuit 122, and an optical modulator 123 are provided in the optical transmitter 120. A continuous wave (CW) optical signal that is emitted from the laser light source 121 is modulated by the optical modulator 123 based on the transmission data outputted from the transmitting circuit 122. The CW optical signal is outputted as a modulated optical signal. That is, the optical transmitter 120 outputs the transmission data with the optical signal.

A driving circuit 132, and an optical module 131 in Embodiment 7, are provided in the optical repeater 130. The driving circuit 132 supplies driving current to a conducting pin that is provided in a module housing 102 of the optical module 131. Thus, the intensity of the modulated optical signal that is attenuated by being transmitted through the optical fiber transmission line 151, is amplified by the optical module 131, which is supplied with power and controlled by the driving circuit 132. The optical signal that is amplified is input to the optical fiber transmission line 152.

An optical receiving device 141 and a receiving circuit 142 is provided in the optical receiver 140. The optical receiving device 141 converts the optical signal that is transmitted by the optical fiber transmission line 152 into an electric signal, and the receiving circuit 142 decodes the received data.

A semiconductor optical amplifier (SOA) 101 (not illustrated) in the optical module 131 amplifies the modulated optical signal so that the optical loss that is generated in the optical fiber transmission line 151 and the like is compensated, and the transmission distance of the modulated optical signal is increased in the optical communication system. Thus, the transmission distance of the optical communication system may be increased with lower power consumption, the optical loss in the optical communication system may be compensated, and higher transmission characteristics may be achieved.

The optical module in Embodiment 7 may be used in optical communication systems other than the optical communication system described in Embodiment 8, and the performance of the optical communication system may be improved and the power consumption may be reduced.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:
1. A semiconductor optical amplifier comprising:
an n-type semiconductor layer;
a p-type semiconductor layer;
an active layer provided between the n-type semiconductor layer and the p-type semiconductor layer, the active layer transmitting an optical signal; and a current-injection part that injects current into the active layer via the n-type semiconductor layer and the p-type semiconductor layer, the active layer includes a first active layer that includes AlGaInAs, and a second active layer that includes GaInAsP, the second active layer provided closer to an output side of the optical signal than the first active layer, and the first active layer and the second active layer are butt-jointed.

2. An optical amplifier comprising:
an n-type semiconductor layer;
a p-type semiconductor layer;
an active layer provided between the n-type semiconductor layer and the p-type semiconductor layer, the active layer transmitting an optical signal; and
a current-injection part that injects current into the active layer via the n-type semiconductor layer and the p-type semiconductor layer,
the active layer includes a first active layer and a second active layer, the second active layer inputting the optical signal output from the first active layer, the first active layer and the second active layer are butt-jointed, and
a differential gain factor of the first active layer is greater than a differential gain factor of the second active layer at a given carrier density.

3. The semiconductor optical amplifier according to claim 1, wherein the active layer includes a barrier layer provided between the first active layer and the second active layer, the barrier layer butt jointed to the first active layer and the second active layer.

4. The semiconductor optical amplifier according to claim 3, wherein the barrier layer includes at least one of InP, InAlAs, InGaP, GaAs, and AlGaInAs.

5. The semiconductor optical amplifier according to claim 3, wherein a length of the barrier layer in a direction that the optical signal is transmitted is 5 nm or longer.

6. The semiconductor optical amplifier according to claim 1, wherein at least one of the first active layer and the second active layer includes a quantum well structure.

7. The semiconductor optical amplifier according to claim 1, wherein at least one of the first active layer and the second active layer is applied with tensile strain.

8. The semiconductor optical amplifier according to claim 1, wherein a thickness of the first active layer and a thickness of the second active layer are different.

9. The semiconductor optical amplifier according to claim 1, wherein the current-injection part includes electrodes that inject current into the first active layer and the second active layer independently.

10. The semiconductor optical amplifier according to claim 1, wherein the n-type semiconductor layer and the p-type semiconductor layer include InP.

11. The semiconductor optical amplifier according to claim 1, further comprising a guide layer formed between the first active layer and the second active layer, and an n-type semiconductor layer, wherein a band-gap wavelength of the guide layer is longer than a band-gap wavelength of the n-type semiconductor layer, and shorter than a band-gap wavelength of the first active layer and a band-gap wavelength of the second active layer.

12. The semiconductor optical amplifier according to claim 1, further comprising an anti-reflection film formed on both sides of the first active layer and the second active layer.

13. The semiconductor optical amplifier according to claim 1, further comprising a semi-insulating semiconductor barrier layer formed on both sides of the first active layer and the second active layer, the semi-insulating semiconductor barrier layer forming a current confinement structure.

14. An optical module comprising:
a semiconductor optical amplifier;
an input part that inputs an optical signal to a first active layer of the semiconductor optical amplifier; and
an output part that outputs the optical signal from a second active layer of the semiconductor optical amplifier, the semiconductor optical amplifier including:
an n-type semiconductor layer;
a p-type semiconductor layer;
an active layer provided between the n-type semiconductor layer and the p-type semiconductor layer, the active layer transmitting the optical signal; and
a current-injection part that injects current into the active layer via
the n-type semiconductor layer and the p-type semiconductor layer, the active layer includes the first active layer including AlGaInAs, and the second active layer including GaInAsP, the second active layer provided closer to an output side of the optical signal than the first active layer, and the first
active layer and the second active layer are butt-jointed.

15. An optical communication system comprising:
a first optical signal transmission line;
an optical repeater that amplifies an optical signal transmitted through the first optical signal transmission line; and
a second optical signal transmission line through which the optical signal that is amplified by the optical repeater is transmitted,
the optical repeater includes an optical module, the optical module including:
a semiconductor optical amplifier;
an input part that inputs the optical signal to a first active layer of the semiconductor optical amplifier; and
an output part that outputs the optical signal from a second active layer of the semiconductor optical amplifier,
the semiconductor optical amplifier including:
an n-type semiconductor layer;
a p-type semiconductor layer;
an active layer provided between the n-type semiconductor layer and the p-type semiconductor layer, the active layer transmitting the optical signal; and
a current-injection part that injects current into the active layer via the n-type semiconductor layer and the p-type semiconductor layer,
the active layer includes the first active layer including AlGaInAs, the second active layer including GaInAsP, the second active layer provided closer to an output side than the first active layer, and the first active layer and the second active layer are butt-jointed.

* * * * *